United States Patent
Davis et al.

(10) Patent No.: US 9,232,683 B2
(45) Date of Patent: Jan. 5, 2016

(54) STORAGE SYSTEM AND A METHOD OF COOLING STORAGE MEDIA WITHIN A DATA STORAGE SYSTEM

(75) Inventors: David M. Davis, Portsmouth (GB); Alexander C. Worrall, Waterlooville (GB)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 493 days.

(21) Appl. No.: 13/189,068

(22) Filed: Jul. 22, 2011

(65) Prior Publication Data
US 2013/0021696 A1 Jan. 24, 2013

(51) Int. Cl.
*H05K 7/20* (2006.01)
(52) U.S. Cl.
CPC ........ *H05K 7/20781* (2013.01); *H05K 7/20772* (2013.01); *H05K 7/20645* (2013.01)
(58) Field of Classification Search
CPC .......... H05K 7/20781; H05K 7/20645; H05K 7/20681; H05K 7/20818; H05K 7/20536–7/20836; G06F 1/20
USPC ............... 361/679.48, 679.53, 696, 699, 701, 361/724–727; 454/184
See application file for complete search history.

(56) References Cited

U.S. PATENT DOCUMENTS

| | | | | |
|---|---|---|---|---|
| 6,378,604 | B1* | 4/2002 | Feind et al. | 165/166 |
| 7,112,131 | B2* | 9/2006 | Rasmussen et al. | 454/184 |
| 7,319,596 | B2* | 1/2008 | Fujiya et al. | 361/727 |
| 7,327,578 | B2* | 2/2008 | Novotny | 361/724 |
| 7,367,384 | B2* | 5/2008 | Madara et al. | 165/122 |
| 7,667,967 | B1* | 2/2010 | Copeland et al. | 361/696 |
| 7,804,687 | B2* | 9/2010 | Copeland et al. | 361/701 |
| 8,300,402 | B2* | 10/2012 | Wei | 361/679.47 |
| 2008/0251240 | A1* | 10/2008 | Madara et al. | 165/122 |
| 2010/0317279 | A1* | 12/2010 | Yatskov | 454/184 |

OTHER PUBLICATIONS

U.S. Appl. No. 12/722,012, filed Mar. 11, 2010, David Michael Davis et al.
U.S. Appl. No. 12/843,725, filed Jul. 26, 2010, Graham Collins.
U.S. Appl. No. 12/843,711, filed Jul. 26, 2010, Graham Collins.

* cited by examiner

*Primary Examiner* — Zachary M Pape
(74) *Attorney, Agent, or Firm* — HolzerIPLaw, PC

(57) ABSTRACT

The invention provides a data storage system and a method of cooling storage media within a data storage system. The data storage system comprises an enclosure; plural drawer structures each containing plural storage media such as disk drives, wherein the storage media are arranged such that air can pass vertically within the system through and between at least 2 of the plural drawers thereby to cool the disk drives in the system by a vertical flow of air within the system; and air flow generating means to generate a vertical flow of air through the drawers.

19 Claims, 8 Drawing Sheets

Rack level cooling
Bottom to Rear with AIR/Liquid heat exchangers -
Room neutral with all heat being passed into the liquid

Prior Art

Fig. 1C

Prior Art

Prior Art

Fig. 4

Prior Art

Fig. 6

Fig. 7
Rack level cooling
Bottom to Rear with AIR/Liquid heat exchangers –
Room neutral with all heat being passed into the liquid

STORAGE SYSTEM AND A METHOD OF COOLING STORAGE MEDIA WITHIN A DATA STORAGE SYSTEM

The present invention relates to a data storage system, referred to hereinafter simply as a "storage system", and a method of cooling storage media within a storage system.

Storage systems typically include plural storage media arranged somehow to enable data to be written to and read from individual media. The plural storage media are interconnected to storage interface modules to create a storage system. The media may be disk drives, solid state drives, or any other form of data storage medium. The storage interface modules may be interface switches, interface controllers, RAID controllers, processing modules or similar. The storage interface modules may be located remotely to the storage media, for example in the rear of an enclosure where the storage media are in the front of the enclosure, or co-located with the storage media, for example Interface switches (SAS Expanders) co-located with the disk drives in the front of an enclosure. From hereon in, the description will refer to a storage system interfacing to disk drives, although it will be appreciated that the disclosure is not limited to storage systems including only disk drives as the storage media. The description will also assume that the storage interface components are remotely located, although it will be appreciated that the disclosure is not limited to remotely located storage interface components, and may equally apply to co-located storage interface components.

As the size and capacity of storage systems increases, there is an increasing need to provide efficient and effective means for temperature control and, in particular, cooling of the media such as disk drives within the storage system. Typically, a storage system includes storage modules which each contain plural disk drives and storage interface modules which provide internal and external connectivity between the storage media and the storage system external data fabric. It is known to pass cooling air through the storage system so as to remove heat produced in operation by the disk drives and thereby provide cooling to the storage system as a whole.

Figure 1A:
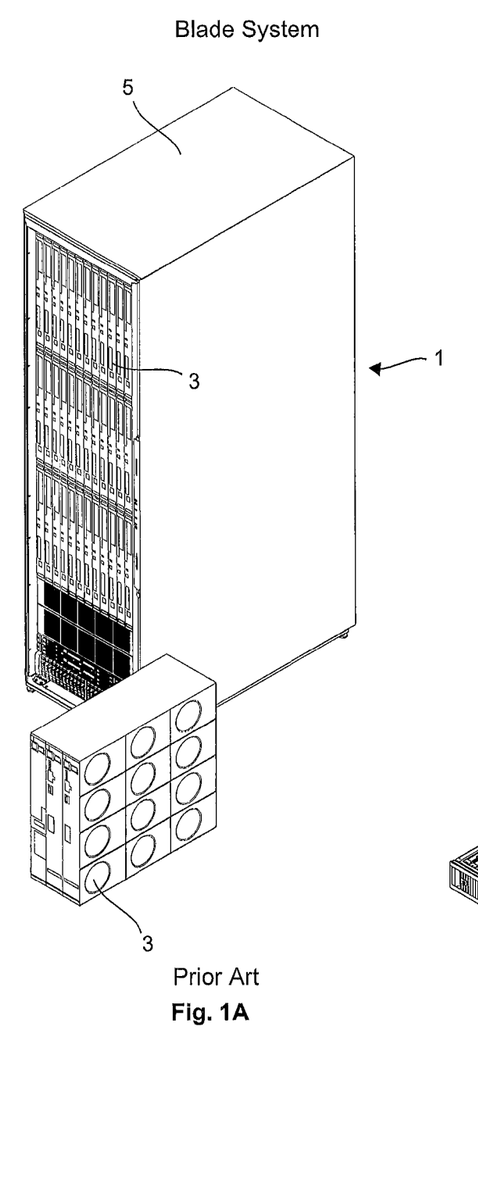
FIG. 1A is a schematic representation of a blade-based storage system.

A typical example of prior art would use a 'blade' type structure. The 'blade' is high but narrow, allowing multiples to be fitted across the width of a rack, typically 10 or 12. Depth is determined by the number of drives being installed, but would typically be 3 drives deep and in to order of 500 mm. The structure of the blades limit the airflow across the installed devices and the density that can be achieved. Fully loaded blades can be heavy and this limits the maintenance and serviceability of the resultant system. Their weight also requires a structure across the width of the rack to support them. FIG. 1A shows a schematic representation of such a blade storage system. As can be seen the storage system 1, comprises plural blades 3 arranged within the housing 5 of the storage system 1. Structure (not shown) across the width of the rack is provided to support the weight of the blades.

Figure 1B:
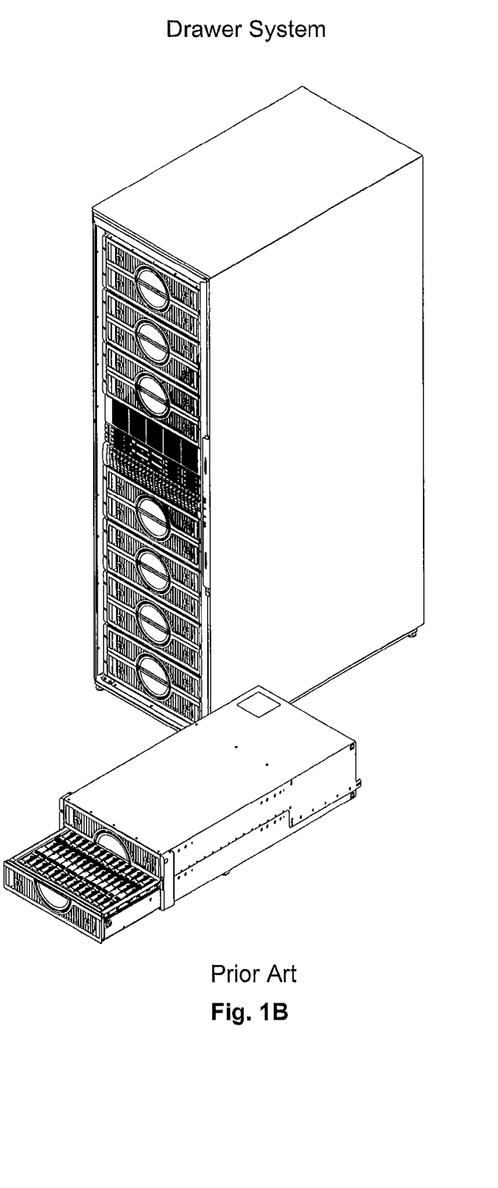
FIG. 1B is a schematic representation of a drawer-based storage system.

In contrast, a drawer-based system, as shown in FIG. 1B, uses a sliding drawer the full (or half) the width of the rack, but of low height. The height is governed by the storage media (or storage interface modules) installed, such that a single storage medium, e.g. an individual disk drive, is accessible and serviceable from the top of the drawer. The depth of the drawer is determined by the number of storage media installed, but is not limited in the same way as the blade. Since every storage media is individually serviceable the overall weight of the drawer does not become a serviceability limit. In contrast to the blade, the drawer is supported at its sides by the rack structure, relying on the strength of the drawer itself to provide support for the installed storage media.

One known storage system of the present application is the ClusterStor system of the present assignee, as described in each of U.S. Ser. No. 12/722,012, U.S. Ser. No. 12/843,725 and U.S. Ser. No. 12/843,711, the entire contents of all of which are hereby incorporated by reference. The ClusterStor system comprises a rack into which are placed plural storage modules. Each of the storage modules contains two drawers which, in turn, each contain plural disk drives. At the rear of the storage system, storage interface modules provide control, input and output functionality. This is the means by which data may be written to or read from disk drives within the storage system.

Figure 1C:
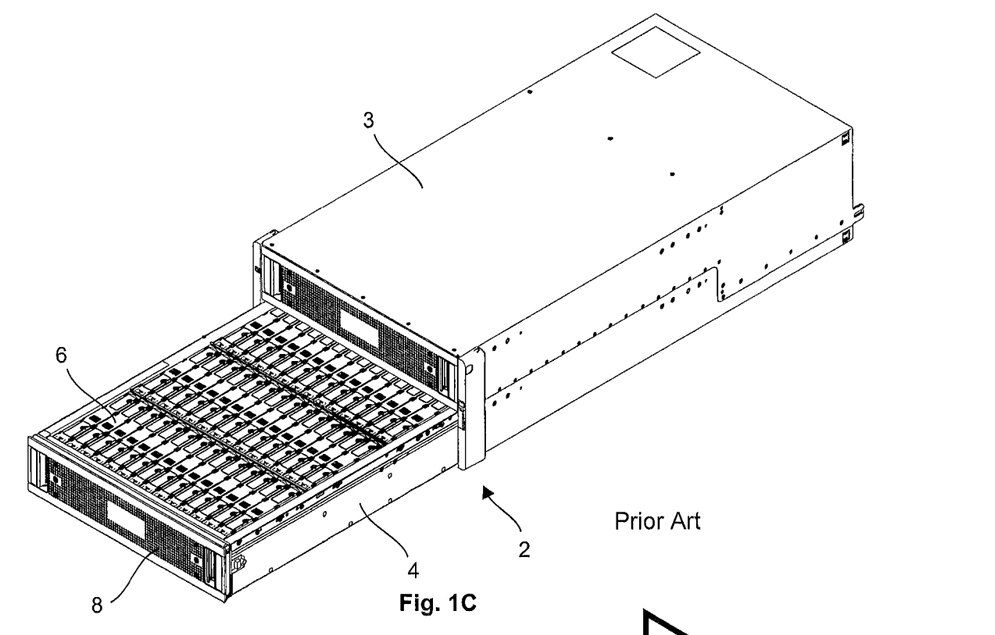
FIG. 1C is a schematic representation of a two-drawer storage module, as might be used in the storage system of FIG. 1B.

FIG. 1C is a perspective view of a storage module as might be used in the ClusterStor system i.e. like the drawer-based system of FIG. 1B, the module having two drawers, each including plural disk drives. As can be seen, the module 2 has an outer housing 3 in which are provided two drawers 4 containing plural disk drives 6. A perforated front plate 8 is provided to the module. In use, the module 2 would be provided in a rack (not shown in FIG. 1) which would typically include plural such modules. Typically, the rack would have a perforated front wall or door and a perforated rear wall or door. The perforations allow for horizontal air flow through the module 2. This therefore enables cooling of disk drives within the drawers 4.

Figure 2:
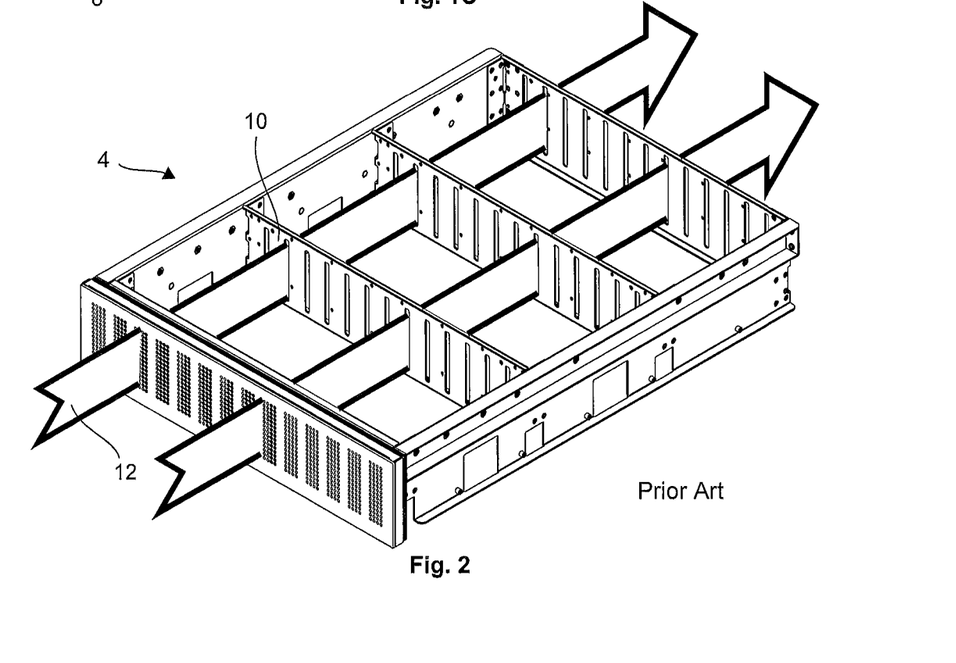
FIG. 2 is a schematic representation of one of the drawers of the module of FIG. 1.

FIG. 2 is a schematic representation of one drawer 4 from the module of FIG. 1 with the disk drives removed. As can be seen, slots 10 are provided between the rows of disk drives. The slots are aligned with the disk drives in such a way that air flow 12 can take place horizontally within the enclosure of the module and through the drawer 4 as a whole thereby cooling the disk drives within it. In the example shown, the drawer would contain 42 disk drives in three rows of fourteen.

Figure 3:
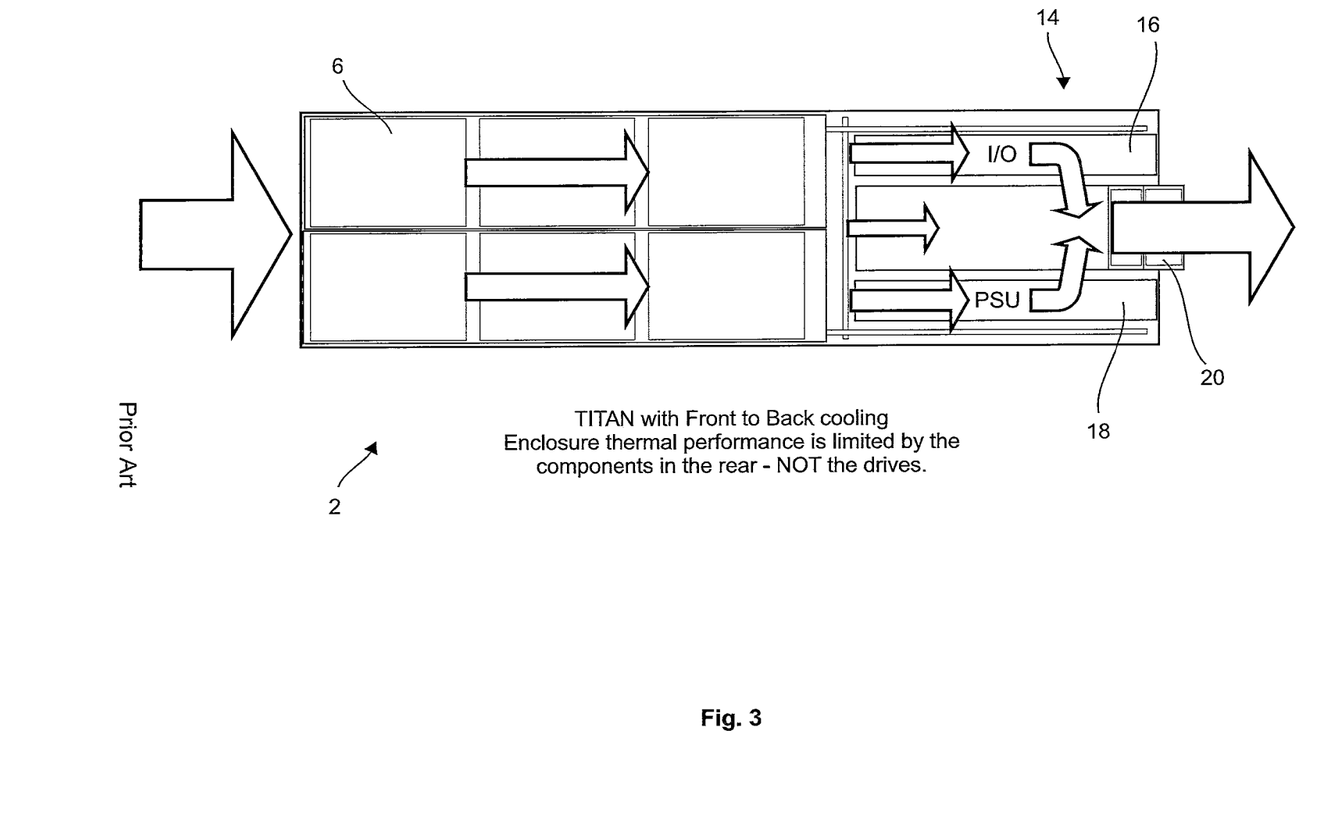
FIG. 3 is a vertical section through the module of FIG. 1 with both drawers closed.

FIG. 3 shows a vertical cross-section through the module 2 with both drawers closed. Control units are provided at the rear 14 of the module 2 and include, in this example, storage interface modules 16 and power supply units 18. A fan 20 or other device for providing air flow is included. When activated, the fan 20 draws air through the disk drives in a horizontal direction as shown thereby cooling the disk drives and the control components in the rear 14 of the module 2.

Figure 4:
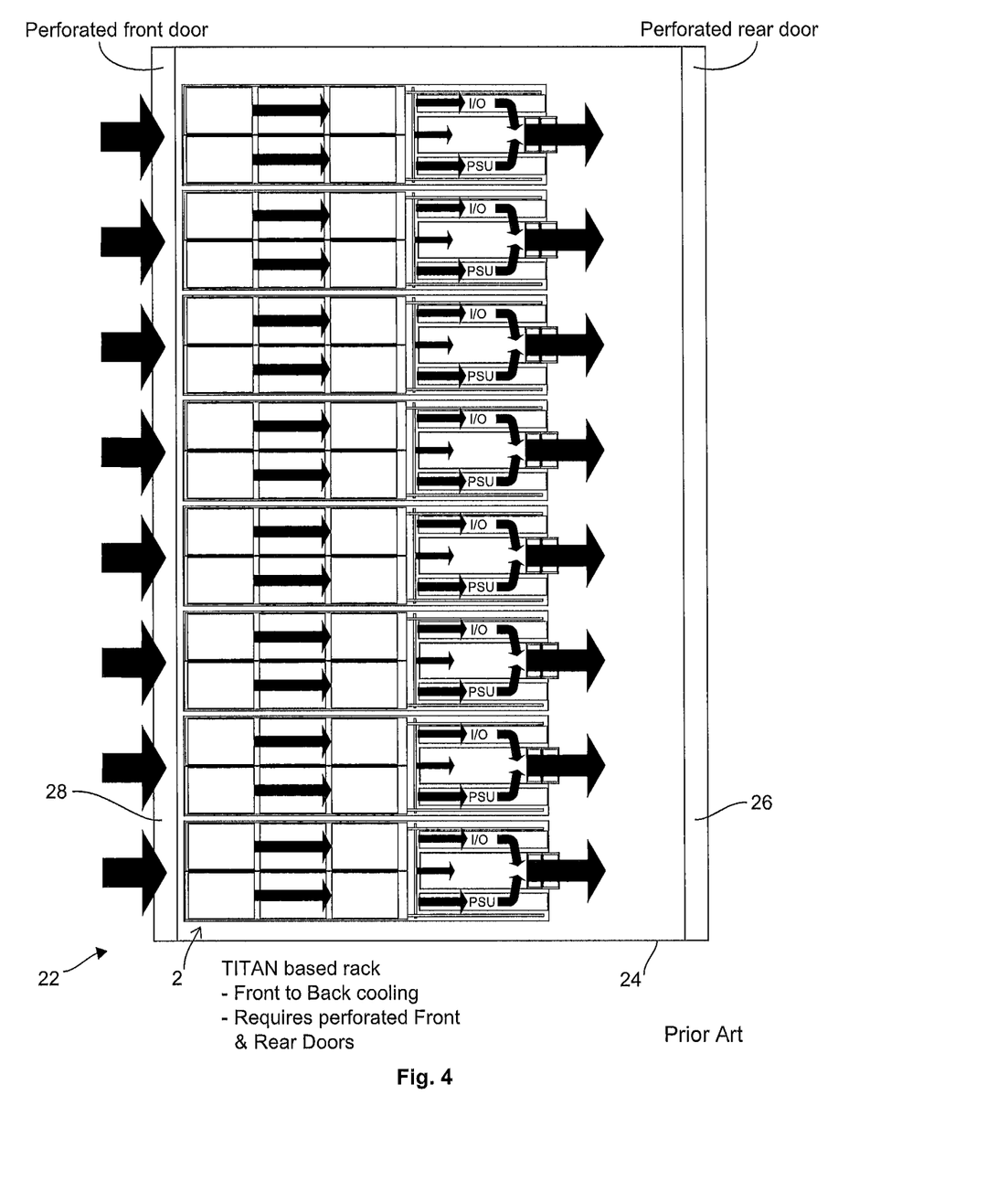
FIG. 4 is a vertical section through a storage rack comprising plural modules such as that of FIG. 1.

FIG. 4 shows a schematic representation of a vertical section through a storage rack 22. The rack includes plural modules 2 arranged within a rack housing 24. The rack housing includes a perforated rear door 26 and a perforated front door 28 which enables horizontal air flow through the individual modules and the rack as a whole. As can be seen, although this means and method of cooling works well, an alternative means and method of cooling is desired which enables an increased packing-density of disk drives to be achieved without sacrificing cooling capability.

According to a first aspect of the present invention, there is provided a data storage system, comprising an enclosure; plural drawer structures each containing plural disk drives, wherein the disk drives are arranged such that air can pass vertically within the system through and between at least 2 of the plural drawers thereby to cool the disk drives in the system by a vertical flow of air within the system; and air flow generating means to generate a vertical flow of air through the drawers. "Vertical" in this context will be understood to mean generally transverse or perpendicular to the major plane of the drawers in the storage system.

In one embodiment, each of the plural drawer structures contains plural storage interface modules as well as the storage media.

By enabling and providing vertical air flow within a storage system including plural storage media such as disk drives, additional housing to direct cooling air or gas, as would be required were horizontal cooling being used, can be avoided. This means that extraneous structure which clearly would take up space within a storage system can be avoided. This, consequently, enables a higher density of storage media to be achieved within a storage system as compared with what would be possible were conventional air flow patterns to be employed.

In an embodiment, the air flow generation means is or are arranged at the bottom of the storage system to blow air vertically upwards through the two or more drawers. This provides a simple and reliable means by which the required vertical airflow within the storage system can be achieved. Furthermore, in a rack, this enables fewer such air flow generation means are required as compared to if horizontal air flow is exclusively used to cool the disk drives. In another embodiment the air flow generation means is or are arranged at the top of the storage system to draw the air vertically upwards through the system. Some combination of these two arrangements can be used.

In an embodiment, the storage system comprises air flow generation means vertically above the two or more drawers to direct air, that has passed vertically through the two or more drawers, horizontally to a rear of the storage system. This provides a simple and reliable means by which the heat, once drawn from the storage media by the vertical passage of air through the drawers, can be exhausted from the storage system. In other words, a combination of vertical and horizontal airflow within the storage system provides a particularly advantageous means by which storage media can be cooled. The horizontal airflow can be used to route air that has passed vertically through the system to be exhausted from the system.

In an embodiment, there is provided a heat exchanger vertically above the two or more drawers to receive heat from air that has passed vertically through the two or more drawers. Thus heat can be removed from the storage system without requiring a hot air exhaust air flow.

In an embodiment, the heat exchanger is an air/liquid heat exchanger. Any appropriate heat transfer fluid could be used. In one example water is used.

According to a second aspect of the present invention, there is provided a method of cooling storage media within a data storage system, in which the data storage system comprises an enclosure and plural drawer structures each containing plural storage media, wherein the disk drives are arranged such that air can pass vertically within the system through and between at least 2 of the plural drawers, the method comprising: generating a vertical flow of air through and between at least 2 of the plural drawers thereby to cool the storage media in the system.

Thus, the method provides a way by which storage media in a storage system can be cooled or have their temperature controlled whilst enabling an increase in the packing density of storage media due to the removal of intermediate structure that is conventionally provided.

In an embodiment, the plural drawer structures each contain one or more storage interface modules as well as the storage media.

In an embodiment, the method comprises generating the vertical air using air flow generation means arranged at the bottom of the storage system to blow air vertically upwards through the two or more drawers.

In an embodiment, the method comprises generating horizontal air flow using air flow generation means vertically above the two or more drawers to direct air that has passed vertically through the two or more drawers horizontally from a rear of the storage system.

In an embodiment, the method comprises using a heat exchanger vertically above the two or more drawers to receive heat from air that has passed vertically through the two or more drawers.

In an embodiment, the method comprises the heat exchanger is an air/water heat exchanger.

According to a further aspect of the present invention, there is provided a data storage system, comprising an enclosure; plural drawer structures each containing plural disk drives, wherein the disk drives are arranged such that air can pass vertically within the system through the plural drawers thereby to cool the disk drives in the system by a vertical flow of air within the system; and air flow generating means to generate a vertical flow of air through the drawers. "Vertical" in this context will be understood to mean generally transverse or perpendicular to the major plane of the drawers in the storage system.

Embodiments of the present invention will now be described in detail with reference to the accompanying drawings, in which.

Figures 5, 5A:
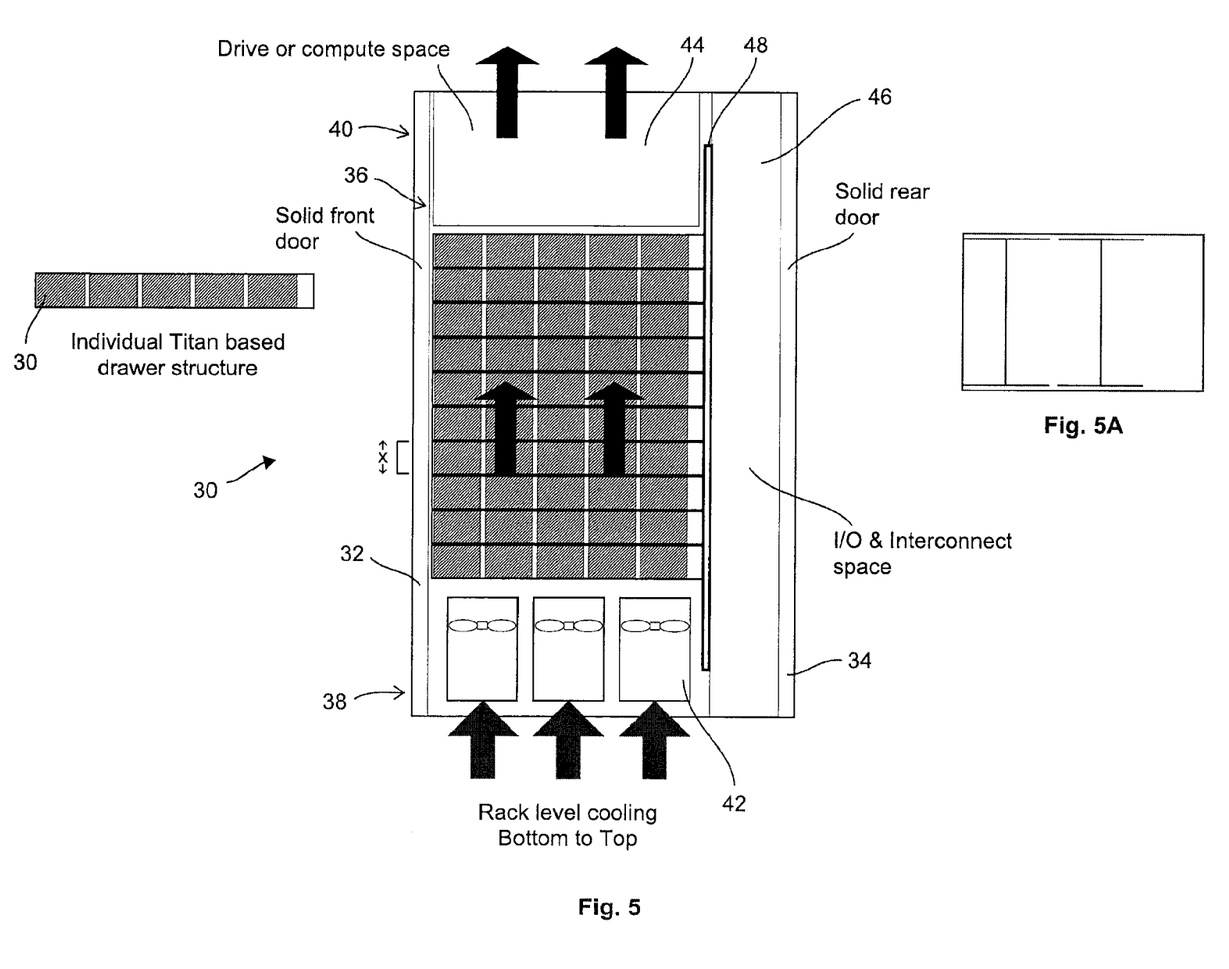
FIG. 5 is a schematic representation of a vertical section through a storage rack.
FIG. 5A is a plan view of a drawer from the rack of FIG. 5.

FIG. 5 shows a schematic representation of a vertical section through a storage rack 30 in which an alternative means and method of cooling is used as compared to that of, say, FIGS. 1 to 4. The rack 30 is provided with a solid front door 32 and a solid rear door 34. Arranged within the storage rack 30 is a plurality of drawers 36 each containing plural rows (five in this case) of storage media (disk drives in this case). There is no intervening structure between the rows or drawers of disk drives such that air can travel directly vertically through and between various of the rows of the disk drives. In particular, in this example, air can travel all the way from the bottom 38 of the rack 30 to the top 40. This provides an efficient and simple means for cooling of the disk drives within the storage rack and, more generally, temperature control of the disk drives.

Furthermore, and importantly, the use of vertical cooling means that it is possible to provide plural drawers in a storage system in the absence of intervening structure between drawers which means that a higher packing density of disk drives can be achieved. In addition, by the use of vertical cooling within a storage system fewer air flow generating means per disk drive can be used. Where horizontal cooling is used a dedicated fan or the like is used for each drawer or storage module. Where vertical cooling is used, the number of fans per disk drive can be reduced meaning that less space need be taken up by the fans thereby enabling a higher packing density of disk drives within a similarly sized storage system or rack to be achieved.

A plurality of airflow generating means 42 are provided. In this case, the airflow generating means 42 are fans such as rotary fans arranged to cause a vertical flow of air between individual disk drives, for cooling, within the storage rack.

As can be seen, due to the structure of the drawers 36, vertical airflow can be achieved through the structure, which in turn means that intervening structure can be removed, and indeed should be. When horizontal cooling is used intervening structure is required to ensure that cooling air is directed and channelled as required to ensure all disk drives within a module are cooled. In contrast where vertical cooling is used, intervening structure is preferably removed so as to enable as long a continuous path as possible for cooling air. Preferably, the continuous path extends all the way from the lowermost drawer within a storage system to the uppermost drawer in the system. In other words, there is preferably a direct and continuous path for cooling air all the way from the bottom of a storage rack to the top.

In addition, since the drawers are supported at the sides of the rack, this enables installation of the drawers in larger systems without the necessity of having a physical enclosure around them.

In contrast to the module of FIG. 2, for example, there is no intervening structure between the drawers which therefore means that air can flow directly from the bottom 38 all the way to the top 40 of the rack. If a module such as that shown in FIG. 1 were simply placed in the rack 5 then vertical airflow through the rack would not be achievable due to the housing of the module 2.

Referring again to FIG. 5, a drive or compute space 44 is provided at the top of the rack 30 and a space 46 for input and output interconnects is provided at the rear of the rack 30. Typically, some component such as an interconnecting plane 48 with appropriate sockets and/or cabling may be provided to enable connection between the input and output space 46 and the disk drives within the drawers 36.

The ladder type construction is preferably created by I-beam sections having a depth that depends on the required depth of the drawer. The depth x of each drawer 36 is determined by the depth of the I-beam components, shown schematically from above in FIG. 5A. The use of such I-beam constructs within a drawer provides a strong vertical structure. The precise dimensions of each drawer can be modified in width or length to accommodate different quantities or types of disk drives or to allow disk drives to be mounted in different orientation, e.g. horizontal or vertical etc. In each case, the ladder structure still enables vertical cooling through plural storage modules.

Figure 6:
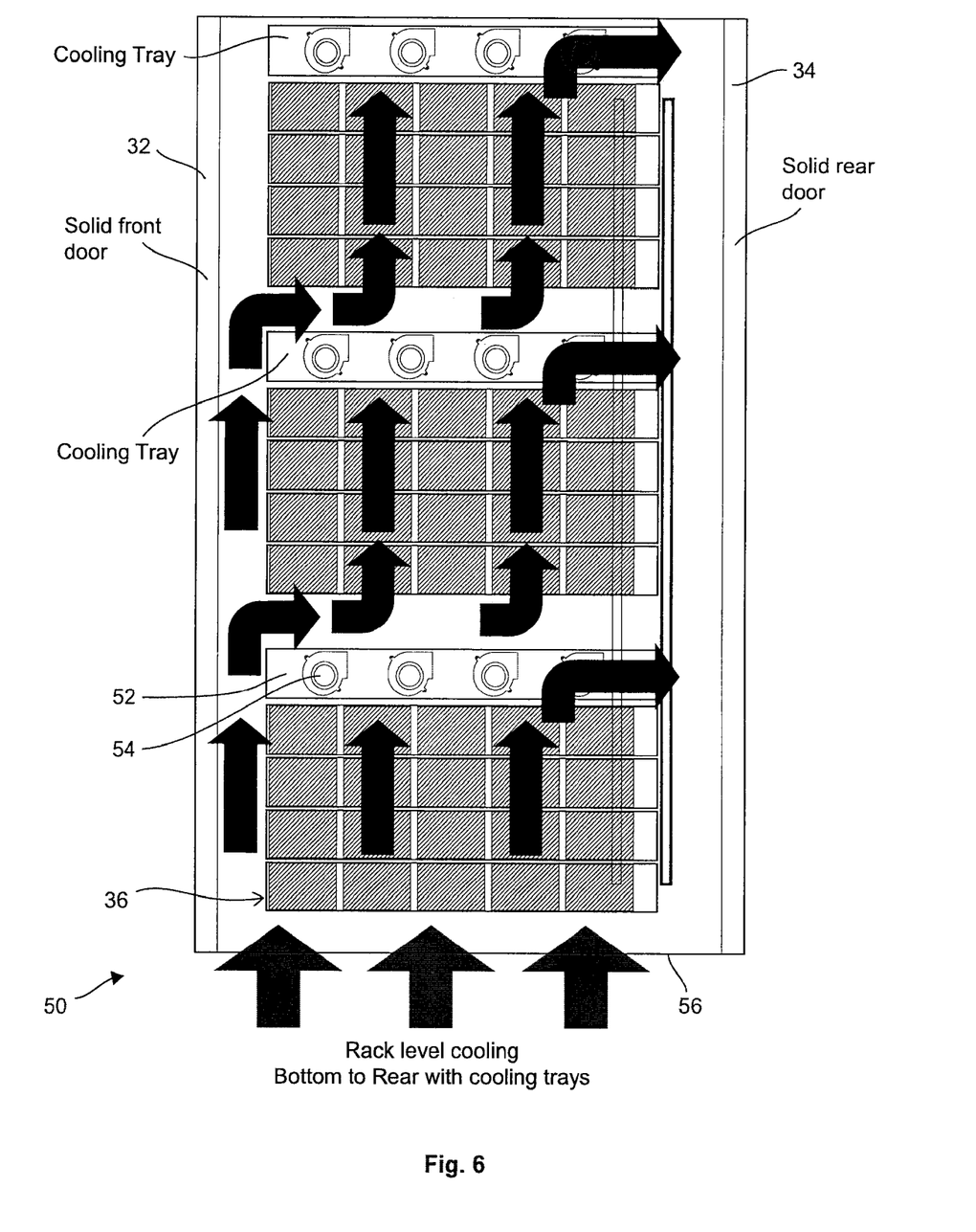
FIG. 6 is a schematic representation of a vertical section through a storage rack.

FIG. 6 shows a further example of a storage rack 50. In this case, the rack 50 comprises plural drawers 36 of the same type as provided in the rack of FIG. 5. However, in this case, between sets of the drawers 36 (each set containing four drawers in this example), cooling trays 52 are provided. Each cooling tray 52 preferably comprises fans or blowers 54 arranged to direct air, drawn vertically through plural of the drawers 36, horizontally to the rear of the device.

The fans 54 within the cooling trays, serve to generate the necessary pressure differentials that draw air upwards through the drawers 36 from which it can be exhausted as appropriate.

An opening (not shown) is preferably provided in the rack 50 to enable the air that has picked up heat from the disk drives, to be exhausted.

It will be appreciated that, like in the rack of FIG. 5, the rack of FIG. 6 also comprises solid front and rear doors 32 and 34. By allowing the airflow to enter from below, air is taken directly from an underfloor plenum. This means that the air flow and pressure are better regulated when compared with a rack with perforated doors and front to back cooling. Racks with perforated doors rely on perforated or grating style floor tiles in front of them for their airflow and thus are affected by other equipment, or even human operators, in the vicinity or localised/transient changes in airflow. As an additional advantage, the solid doors ensure that dirt and contaminants that might be introduced were airflow provided horizontally through the drawers can be avoided. Typically, within a storage centre, plural racks are provided and each of the racks has a perforated lower surface 56 through which air can be drawn for cooling.

Figure 7:
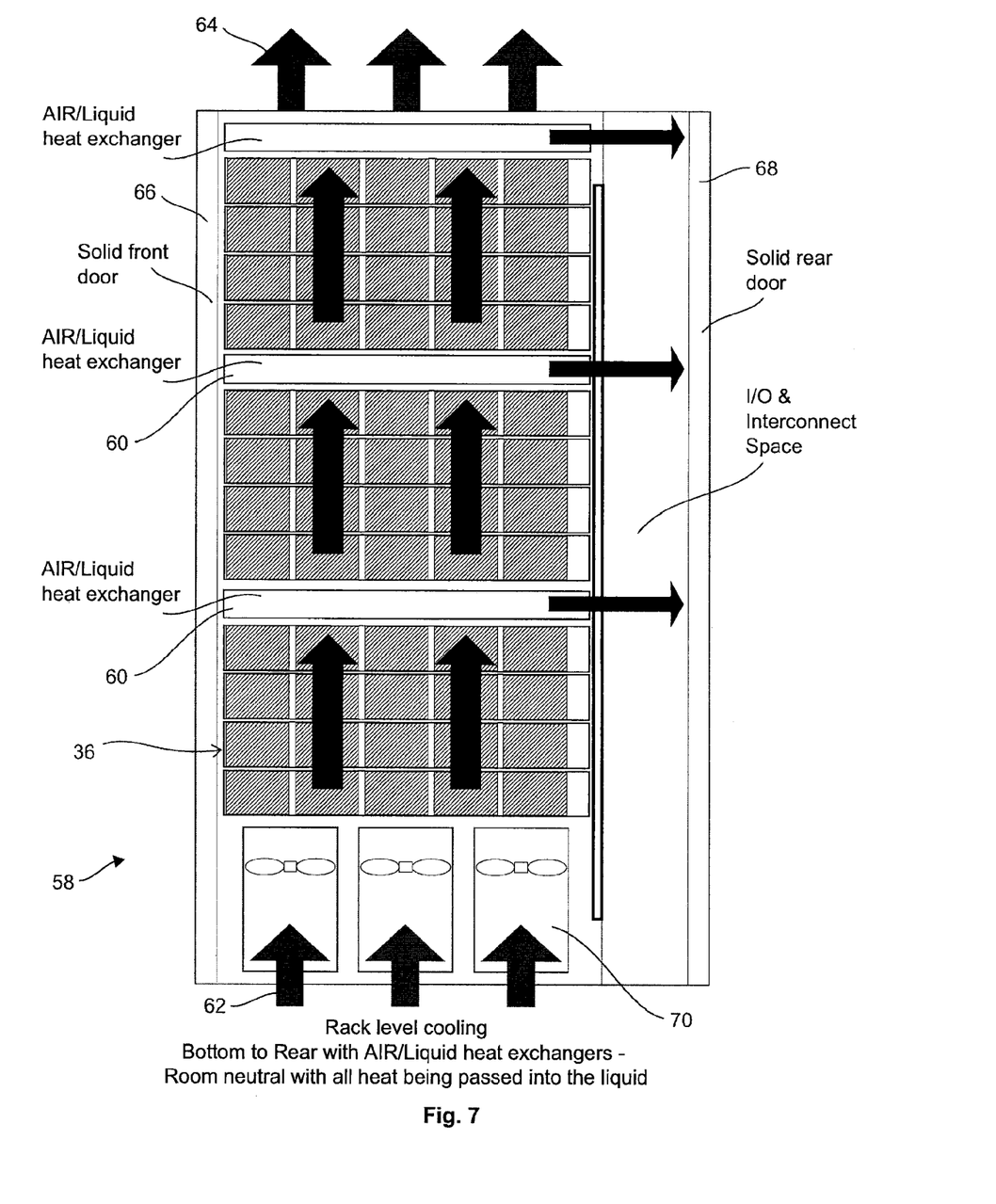
FIG. 7 is a schematic representation of a vertical section through a storage rack.

FIG. 7 shows a further example of a storage rack 58. The rack 58 is similar to that shown in and described with reference to FIG. 6. However, in this case, instead of a cooling tray comprising fans or blowers being provided, heat exchangers 60 are provided between sets of the drawers 36, with no intervening structure being provided between drawers in a set. Each heat exchanger 60 serves to remove heat from the airflow as it passes vertically through the rack 58. Air travels continuously from the bottom 62 of the rack 58 and is exhausted at the top in an exhaust airflow 64. Heat, is picked up by the air as it passes between the disk drives within the drawers 36. Once it has passed the first heat exchanger it is of course cooled so that it has a greater capacity for cooling disk drives within the second set of drawers, and so on with the second heat exchanger and third set of drawers.

In this example, again, a solid front and rear door 66 and 68 are provided which provides a more consistent airflow and enables dirt and other such contaminants to be more easily kept out of the storage rack. Preferably the heat exchangers are air/liquid heat exchangers as these provide a particularly convenient means of cooling air within a data centre. Typically a source of cooled liquid, such as water, is used and one or more pumps serve to route the cool liquid within channels in the heat exchangers so that the liquid can receive heat from air which the air has received from the disk drives.

The use of heat exchangers 60 ensures that the room in which the rack is arranged is "temperature neutral" with all heat generated by the disk drives within the drawers 36 being transferred to the liquid in the heat exchangers 60. The fans 70 are arranged to generate the flow of air by which heat may be transferred from the disk drives to the heat exchangers 60. Any appropriate fans may be used. Typically, rotary fans are used for generating the required airflow. Control of the fans may be achieved either internally by the rack control system or via some external control means.

Figure 8:
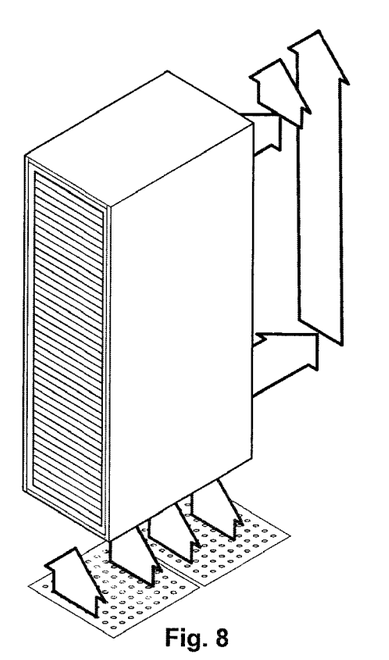
FIGS. 8 and 9 are schematic representation of perspective views of storage racks.

The structure of the storage system is particularly advantageous. In particular, the use of drawers which effectively have no outer walls, but simply are provided as a "ladder type" structure, enable vertical cooling to be achieved and therefore the drawers to be configured in a large storage system using a common cooling mechanism, sealed at the front and back to external air. Instead controlled air provided from an air supply system within a data storage centre may be provided directly through a perforated lower surface of the rack FIG. 8 shows a schematic perspective representation of the storage system of FIG. 6. In particular, cooling air is provided from below the data centre floor. The cooling trays (not shown in FIG. 8) serve to collect the vertical airflow and push it to the exit at the rear of the rack.

Figure 9:
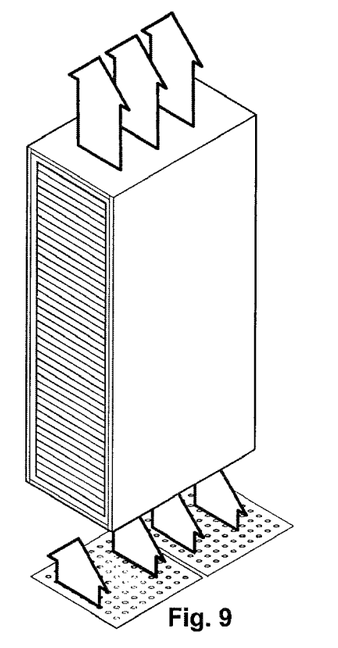

FIG. 9 shows a schematic representation of a closed system identical or similar to that of FIG. 7. Cool air is again supplied from below the rack through the data centre floor. Air passes through the storage system 58 and exits to the top of the rack. This could typically be by hot air convection or assisted by fan trays (not shown). In the example of FIG. 9, liquid cooling is used via one or more heat exchangers 60 mounted horizontally within the rack 58.

The use of a drawer type system enables continuous vertical cooling to be achieved in a horizontal drawer type system which therefore still allows individual drive servicing. Indeed, the use of a drawer type structure has the advantage that if an individual drive within a rack needs servicing or changing, easy access can be obtained to it. The use of vertical cooling has the advantage that within such a system a higher capacity for disk drives or control within the rack can be achieved.

In the present method, disk drives are arranged in drawers which are open in the sense that there is a defined path for airflow between drawers and pairs of drawers such that air introduced through a lower surface of a disk drive drawer can pass through that disk drive drawer and then continuously through the drawer immediately above.

The present system provides a structure and method by which a storage module may be cooled by passing air across it in the vertical direction as opposed to front to rear as normally used in storage enclosures. The preferable structure for each of the drawers is that of a ladder type structure that supports and passes signals to the disk drives. The ladder type structure is open and the absence of constraining physical enclosure to the drawers themselves, allows them to be configured in a large rack-type system where multiple storage modules are installed into a system.

Embodiments of the present invention have been described with particular reference to the examples illustrated. However, it will be appreciated that variations and modifications may be made to the examples described within the scope of the present invention.

The invention claimed is:

1. A data storage system, comprising an enclosure having a first solid door and a second solid door in a side opposite the first solid door, a bottom surface air inlet and an air exhaust;
    plural drawer structures extending horizontal and vertically stacked one above another in the enclosure with a heat exchanger present between adjacent drawer structures, each drawer structure containing plural storage media, the storage media arranged such that air can pass vertically within the enclosure through and between the storage media on each of the plural drawer structures thereby to cool the storage media in the enclosure by a vertical flow of air through the plural storage media and a horizontal flow of air from the heat exchanger to an interconnect space in the enclosure void of the plural drawer structures; and
    an air flow generator positioned within the enclosure and configured to generate the vertical flow of air from the bottom surface air inlet to the air exhaust and through the storage media.

2. A storage system according to claim 1, in which each of the plural drawer structures contains one or more storage interface modules as well as the storage media.

3. A storage system according to claim 2, in which the air flow generator is at the bottom of the storage system to blow air vertically upwards through the plural drawer structures.

4. A storage system according to claim 1, in which the air flow generator is at the bottom of the storage system to blow air vertically upwards through the plural drawer structures.

5. A storage system according to claim 4, further comprising a second air flow generator vertically above the plural drawer structures to direct air that has passed vertically through the plural drawer structures horizontally to a rear of the enclosure.

6. A storage system according to claim 1, in which the air flow generator is at the top of the storage system to draw air vertically upwards through the plural drawer structures.

7. A storage system according to claim 1, in which the air flow generator is vertically above the plural drawer structures to direct air that has passed vertically through the plural drawer structures horizontally to a rear of the enclosure.

8. A storage system according to claim 1, in which the heat exchanger is an air/liquid heat exchanger.

9. A storage system according to claim 1, in which the storage media comprise one or more of disk drives and solid state drives.

10. A system according to claim 1, wherein the air exhaust is through a top surface of the enclosure.

11. A method of cooling storage media within a data storage system, in which the data storage system comprises an enclosure having a first solid door and a second solid door opposite the first solid door, an interconnect space in the enclosure proximate the second solid door, and plural drawer structures extending horizontally and vertically stacked one above another in the enclosure with a heat exchanger present between drawer structures, each drawer structure containing plural storage media, the storage media arranged such that air can pass vertically within the system through or between the plural storage media, the method comprising:
    generating a vertical flow of air, using an air flow generator in the enclosure, through a perforated bottom surface of the enclosure and vertically upwards through the plural drawer structures and through or between the plural storage media to cool the storage media;
    outputting air from each heat exchanger horizontally to the interconnect space within the enclosure; and
    exhausting heated air through an outlet at a top of the enclosure.

12. A method according to claim 11, in which the plural drawer structures each contain one or more storage interface modules as well as the storage media.

13. A method according to claim 12, generating the vertical air using an air flow generator at the bottom of the storage system to blow air vertically upwards through the plural drawer structures.

14. A method according to claim 12, comprising generating horizontal air flow using an air flow generator vertically above the plural drawer structures to direct air that has passed vertically through the plural drawer structures horizontally to a rear of the storage system.

15. A method according to claim 11, comprising generating horizontal air flow using an air flow generator vertically above the plural drawer structures to direct air that has passed vertically through the plural drawer structures horizontally to a rear of the enclosure.

16. A method according to claim 11, in which the heat exchanger is an air/liquid heat exchanger.

17. A method comprising:
    inputting air through a perforated bottom surface of an enclosure that has a top, a solid front with a solid front door and a solid rear with a solid rear door and that contains storage media in drawer structures extending horizontally and vertically stacked one above another, heat exchangers present between adjacent vertically stack drawer structures, and an interconnect space proximate the solid rear;

generating a vertical flow of air through or between the storage media via at least one fan located within the enclosure to cool the storage media;

generating horizontal flow of air between adjacent vertically stacked drawer structures toward the rear of the enclosure into the interconnect space;

and exhausting heated air from the top of the enclosure.

18. A method according to claim 17, further comprising cooling the vertical flow of air with the heat exchangers present between the adjacent vertically stacked drawer structures.

19. A method according to claim 17, in which the heat exchangers are air/liquid heat exchangers.

* * * * *